(12) United States Patent
Kang

(10) Patent No.: US 10,886,355 B2
(45) Date of Patent: Jan. 5, 2021

(54) LIQUID CRYSTAL DISPLAY DEVICE

(71) Applicant: SAMSUNG DISPLAY CO., LTD., Yongin-si (KR)

(72) Inventor: Hyeoncheol Kang, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 88 days.

(21) Appl. No.: 15/954,742

(22) Filed: Apr. 17, 2018

(65) Prior Publication Data

US 2019/0317373 A1 Oct. 17, 2019

(51) Int. Cl.
*H01L 21/66* (2006.01)
*H01L 27/32* (2006.01)

(52) U.S. Cl.
CPC ...... *H01L 27/3276* (2013.01); *H01L 27/3262* (2013.01); *H01L 27/3265* (2013.01)

(58) Field of Classification Search
CPC ............. H01L 27/3276; H01L 27/3262; H01L 27/326–3265
See application file for complete search history.

(56) References Cited

U.S. PATENT DOCUMENTS

| | | | |
|---|---|---|---|
| 6,326,641 B1 * | 12/2001 | Choi | G02F 1/136213 257/296 |
| 7,271,868 B2 | 9/2007 | Lee | |
| 7,777,824 B2 * | 8/2010 | Jeong | G02F 1/136259 349/192 |
| 8,603,866 B2 | 12/2013 | Kim et al. | |
| 2003/0137255 A1 * | 7/2003 | Park | G09G 3/3233 315/169.3 |
| 2006/0258035 A1 | 11/2006 | Ooishi | |
| 2010/0302484 A1 | 12/2010 | Yoo et al. | |
| 2012/0050662 A1 | 3/2012 | Hsu et al. | |

FOREIGN PATENT DOCUMENTS

| | | |
|---|---|---|
| KR | 20020017437 A | 3/2002 |
| KR | 1020080041015 A | 5/2008 |
| KR | 1020080054338 A | 6/2008 |

* cited by examiner

*Primary Examiner* — Amar Movva
(74) *Attorney, Agent, or Firm* — Cantor Colburn LLP

(57) ABSTRACT

A display device includes: a substrate including a display area at which an image is displayed; and on the substrate in the display area thereof: a data line and a gate line on the substrate; a thin film transistor connected to the gate line and the data line; a pixel electrode connected to the thin film transistor; and a storage line which overlaps the pixel electrode. The storage line has a first hole at a position overlapping the data line.

20 Claims, 8 Drawing Sheets

LIQUID CRYSTAL DISPLAY DEVICE

BACKGROUND

1. Field

Embodiments of the invention relate to a display device, and more particularly, to a display device capable of reducing disconnection of a data line.

2. Description of the Related Art

Liquid crystal display ("LCD") devices are one of the most widely used types of flat panel display ("FPD") devices. An LCD device includes two substrates including electrodes formed thereon and a liquid crystal layer interposed therebetween. Upon applying voltage to the two electrodes, liquid crystal molecules of the liquid crystal layer are rearranged such that an amount of transmitted light is controlled in the LCD device.

SUMMARY

Embodiments of the invention may be directed to a display device capable of easily repairing disconnection defects of a data line.

According to an exemplary embodiment, a display device includes: a substrate including a display area at which an image is displayed; and on the substrate in the display area thereof: a data line and a gate line on the substrate; a thin film transistor connected to the gate line and the data line; a pixel electrode connected to the thin film transistor; and a storage line which overlaps the pixel electrode. The storage line has a first hole at a position overlapping the data line.

The storage line may include a horizontal portion parallel to the gate line and a vertical portion parallel to the data line.

At a position of the data line, the horizontal portion may have the first hole at a position overlapping the data line.

At a position of the data line, the vertical portion may have a second hole at a position overlapping the data line.

The vertical portion may extend from the horizontal electrode portion at a position of the data line.

According to an exemplary embodiment, a display device includes: a substrate including a display area at which an image is displayed; and on the substrate in the display area thereof; a data line and a gate line on the substrate; a thin film transistor connected to the gate line and the data line; a pixel electrode connected to the thin film transistor; and a storage line which overlaps the pixel electrode. The data line includes a protruding portion extended toward the pixel electrode to overlap the storage line.

The protruding portion may be disposed parallel with the gate line.

The protruding portion may overlap the pixel electrode.

The storage line may include a horizontal portion parallel to the gate line and a vertical portion parallel to the data line.

The vertical portion may be disposed between the pixel electrode and the data line.

The protruding portion may overlap the vertical portion.

The protruding portion may overlap the pixel electrode.

The vertical portion may extend from the horizontal portion at a position of the data line.

The storage line may further include a bent portion connecting the horizontal portion and the vertical portion to each other.

The protruding portion may overlap the bent portion.

The protruding portion may overlap the pixel electrode.

The foregoing is illustrative only and is not intended to be in any way limiting. In addition to the illustrative exemplary embodiments and features described above, further exemplary embodiments and features will become apparent by reference to the drawings and the following detailed description.

BRIEF DESCRIPTION OF THE DRAWINGS

A more complete appreciation of the invention will become more apparent by describing in detail exemplary embodiments thereof with reference to the accompanying drawings, where.

DETAILED DESCRIPTION

Figure 1:
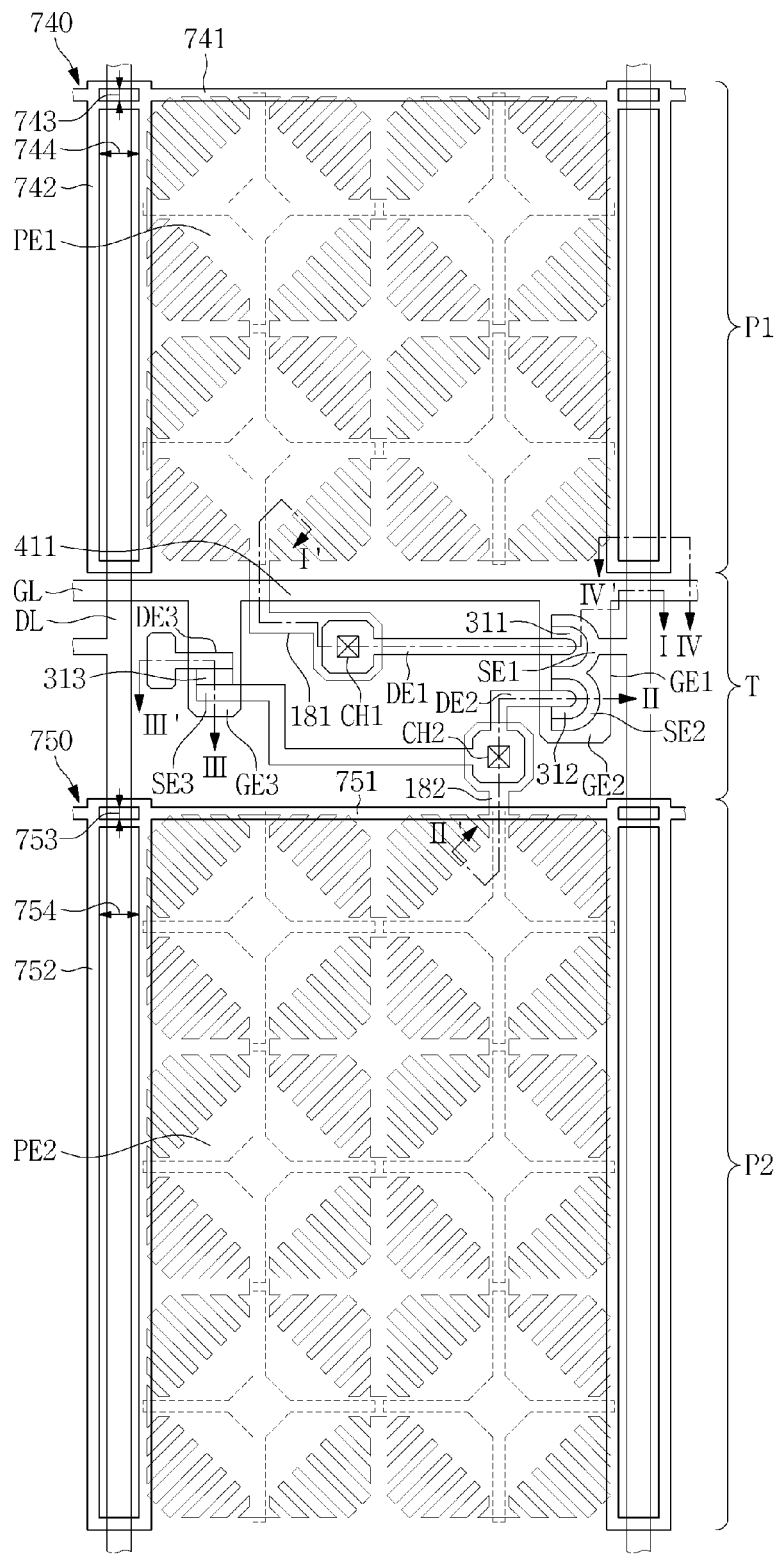
FIG. 1 is a top plan view schematically illustrating an exemplary embodiment of a pixel of a display device according to the invention.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area or plate is referred to as being "on" another layer, area or plate, it may be directly on the other layer, area or plate, or intervening layers, areas or plates may be present therebetween. Conversely, when a layer, area or plate is referred to as being "directly on" another layer, area or plate, intervening layers, areas or plates are absent therebetween. Further when a layer, area or plate is referred to as being "below" another layer, area or plate, it may be directly below the other layer, area or plate, or intervening layers, areas or plates may be present therebetween. Conversely, when a layer, area or plate is referred to as being "directly below" another layer, area or plate, intervening layers, areas or plates are absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "mechanically connected" or "physically connected" to the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Some of the parts which are not associated with the description may not be provided in order to specifically describe embodiments of the invention and like reference numerals refer to like elements throughout the specification.

A display device such as a liquid crystal display ("LCD") device, displays an image with light. The image may be generated and/or displayed at a display area of a display panel of the display device, such as by a pixel disposed in the display area. Within the display device, a signal is applied to a thin film transistor of a pixel using conductive signal lines, such as a data line and a gate line without being limited thereto. Light is generated within the display panel to display the image (e.g., self-emissive display device) or light is generated outside the display panel and provided thereto to display the image (e.g., non-self-emissive display device).

When a conductive signal wiring such as the data line is electrically open due to foreign substances introduced in a process of manufacturing the display device, a separate conductive wiring is formed for repairing the electrical connections within the display device. However, the forming of the separate conductive wiring is an additional process leading to a decrease in process efficiency. In addition, when a conductive signal wiring such as the data line is electrically open after the manufacturing process is completed, repairing the defective electrical connections due to the electrically open signal line within the completed display device may be difficult. In addition, when a conventional signal wiring of the prior art, e.g., a conductive storage line, is used as a repair wiring, the signal wiring may not serve an original function thereof such as for transmitting a voltage signal for displaying an image.

Figure 2:
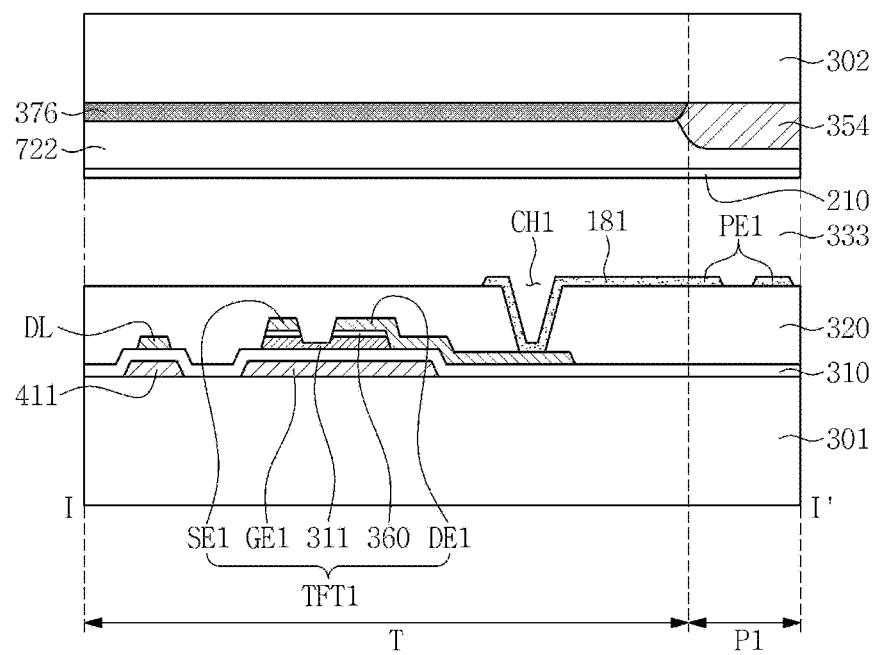
FIG. 2 is an enlarged cross-sectional view taken along line I-I' of FIG. 1.
Figure 3:
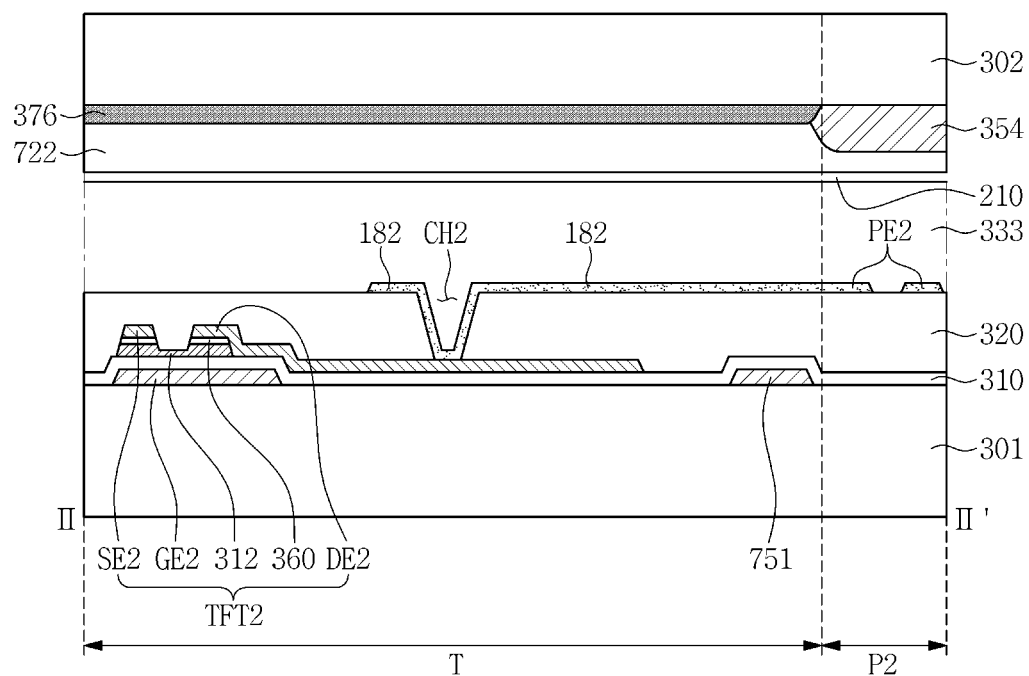
FIG. 3 is an enlarged cross-sectional view taken along line II-II' of FIG. 1.
Figure 4:
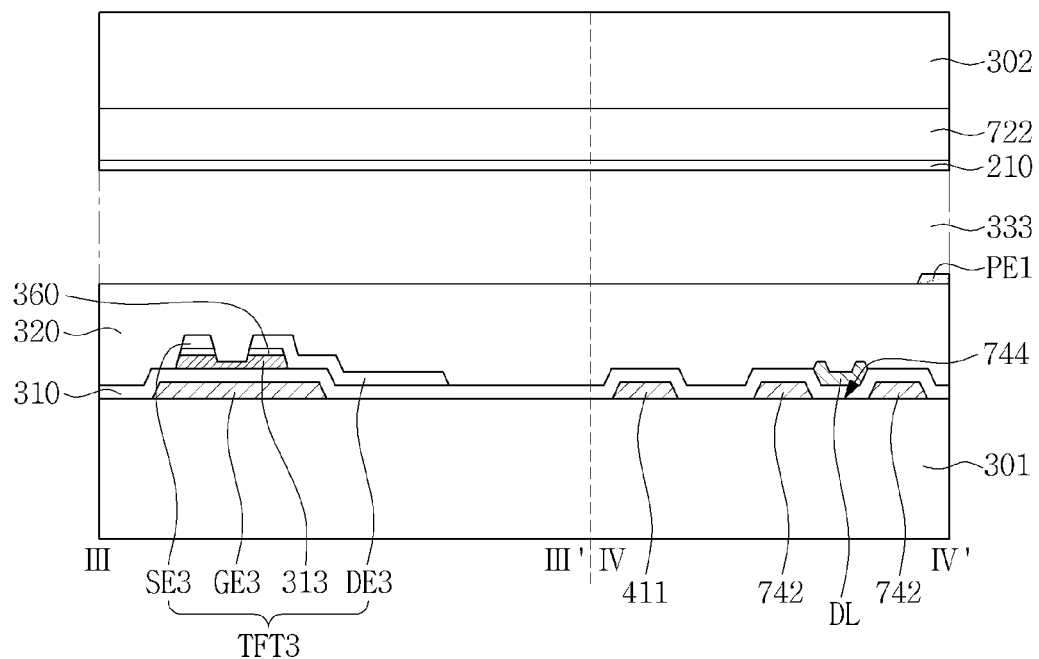
FIG. 4 is an enlarged cross-sectional view taken along line and line IV-IV' of FIG. 1.

FIG. 1 is a top plan view schematically illustrating an exemplary embodiment of a pixel of a display device according to the invention, FIG. 2 is an enlarged cross-sectional view taken along line I-I' of FIG. 1, FIG. 3 is an enlarged cross-sectional view taken along line II-II' of FIG. 1, and FIG. 4 is an enlarged cross-sectional view taken along line and line IV-IV' of FIG. 1.

As illustrated in FIGS. 1, 2, 3 and 4, a single one pixel within the display area of the display device includes a first thin film transistor TFT1, a second thin film transistor TFT2, a third thin film transistor TFT3, a storage line 740 and 750, a color filter 354, a first sub-pixel electrode PE1, a first extension electrode 181, a second sub-pixel electrode PE2, a second extension electrode 182, a common electrode 210, and an optical control layer such as a liquid crystal layer 333 which controls transmittance of light for displaying an image. The storage line 740 and 750 will be described as a first storage line 740 and a second storage line 750, separately, for convenience of explanation. Any of the above-described elements may be provided in plurality within a display panel of the display device.

The display device and components thereof are disposed in a plane defined by a first direction (e.g., horizontal in FIG. 1) and a second direction (e.g., vertical in FIG. 1) which cross each other. A thickness of the display device and components thereof is defined in a third direction (e.g., vertical in FIGS. 2-4) which crosses each of the first and second directions. The display device and components thereof may define a length which is larger than a width thereof. The width may be defined in a direction perpendicular to the length direction.

As being unitarily formed, a portion of one element among a collection of elements may extend to define another one or all of the other elements among the collection thereof. In an exemplary embodiment, elements being unitarily formed may be disposed in a same single layer of the display device among layers disposed on a base substrate thereof and/or may be formed from a same single material layer in a method of manufacturing the display device.

The first thin film transistor TFT1 includes a first gate electrode GE1, a first semiconductor layer 311, a first drain electrode DE1 and a first source electrode SE1, as illustrated in FIG. 1 and FIG. 2.

The second thin film transistor TFT2 includes a second gate electrode GE2, a second semiconductor layer 312, a second drain electrode DE2 and a second source electrode SE2, as illustrated in FIG. 1 and FIG. 3.

The third thin film transistor TFT3 includes a third gate electrode GE3, a third semiconductor layer 313, a third drain electrode DE3, and a third source electrode SE3, as illustrated in FIG. 1 and FIG. 4.

As illustrated in FIG. 1, a gate line GL is located on a first (base) substrate 301. In an exemplary embodiment, for example, the gate line GL is located at a transistor area T of the first substrate 301. The transistor area T is located between a first sub-pixel area P1 and a second sub-pixel area P2. The sub-pixel areas P1 and P2 may be considered a display portion of the pixel while the transistor area T may be considered a non-display portion of the pixel.

The gate line GL includes or is defined by a line portion 411, and a first gate electrode GE1, a second gate electrode GE2 and a third gate electrode GE3 each extending from the line portion 411. The line portion 411 defines a length thereof extended in a first direction (e.g., horizontal in FIG. 1), while the first to third gate electrodes GE1 to GE3 define lengths thereof extended in a second direction (e.g., vertical in FIG. 1) from the line portion 411. The line portion 411 and the first to third gate electrodes GE1 to GE3 have line widths different from each other. In an exemplary embodiment, for example, the first, second and third gate electrodes GE1, GE2 and GE3 may have a line width larger than a line width of the line portion 411. The line portion 411 and the first, second and third gate electrodes GE1, GE2 and GE3 are unitarily formed.

Although not illustrated, a contact portion (e.g., an end or terminal portion) of the gate line GL may have a planar area larger than a planar area of other portions of the gate line GL for connection to another layer of the display device or an external driving circuit (not shown). The end or terminal portion of the gate line GL may be disposed outside the display area of a display panel, such as in a non-display area thereof at which an image is not displayed.

The gate line GL may include or be formed of one of: aluminum (Al) or alloys thereof, silver (Ag) or alloys thereof, copper (Cu) or alloys thereof and/or molybdenum (Mo) or alloys thereof. In addition, the gate line GL may include or be formed of one of: chromium (Cr), tantalum (Ta) and/or titanium (Ti). In addition, the gate line GL may have a single layer structure or a multilayer structure including at least two conductive layers that have different physical properties from each other.

The first storage line 740 is located on the first substrate 301. In an exemplary embodiment, for example, the first storage line 740 is lengthwise extended at boundary portions of the transistor area T and the first sub-pixel area P1 of the first substrate 301 and is disposed at opposing sides of the data line DL to be considered as disposed around the data line DL. The first storage line 740 is adjacent to one side of the first sub-pixel electrode PE1. In an exemplary embodiment, for example, portions of a collective one of the first storage line 740 may be located at an upper side, a left side and a right side of the first sub-pixel electrode PE1, as illustrated in FIG. 1. Lengthwise extended portions of the first storage line 740 may have a linear shape, as illustrated in FIG. 1. In such an exemplary embodiment, the first storage line 740 and the first sub-pixel electrode PE1 may overlap each other or may not overlap each other. When the first storage line 740 overlaps the first sub-pixel electrode PE1, a portion of the first storage line 740 may overlap at least one side of the first sub-pixel electrode PE1. Where the first-sub-pixel electrode PE1 includes a stem (portion) electrode and branch electrodes which extend from the stem portion, the portion of the storage line may also overlap a stem electrode of the first sub-pixel electrode PE1.

Alternatively, dissimilar to FIG. 1, the first storage line 740 may not overlap the stem electrode of the first sub-pixel electrode PE1 and may overlap only an edge portion of the first sub-pixel electrode PE1.

The first storage line 740 receives a first storage voltage from outside thereof, such as from a component of the display device disposed outside the display panel and/or outside the display area thereof. The first storage voltage may be a direct-current ("DC") voltage.

The first storage line 740 may include a substantially same material and may have a substantially same structure (a single or multilayer structure) as those of the above-described gate line GL. In other words, the gate line GL and the first storage line 740 may be disposed in a same layer among layers disposed on the first substrate 301. In an exemplary embodiment, the gate line GL and the first storage line 740 may be formed substantially simultaneously in a substantially same process, such as from a same single material layer, in a method of manufacturing the display device.

The second storage line 750 is located on the first substrate 301. In an exemplary embodiment, for example, the second storage line 750 is lengthwise extended at boundary portions of the transistor area T and the second sub-pixel area P2 of the first substrate 301 and is disposed at opposing sides of the data line DL to be considered as disposed around the data line DL. The second storage line 750 is adjacent to one side of the second sub-pixel electrode PE2. In an exemplary embodiment, for example, the second storage line 750 may be located at an upper side, a left side and a right side of the second sub-pixel electrode PE2, as illustrated in FIG. 1. Lengthwise extended portions of the second storage line 750 may have a linear shape, as illustrated in FIG. 1. In such an exemplary embodiment, the second storage line 750 and the second sub-pixel electrode PE2 may overlap each other or may not overlap each other. When the second storage line 750 overlaps the second sub-pixel electrode PE2, a portion of the second storage line 750 may overlap at least one side of the second sub-pixel electrode PE2. Where the second sub-pixel electrode PE2 includes a stem (portion) electrode and branch electrodes which extend from the stem portion, the portion of the storage line may also overlap a stem electrode of the second sub-pixel electrode PE2.

Alternatively, dissimilar to FIG. 1, the second storage line 750 may not overlap the stem electrode of the second sub-pixel electrode PE2 and may overlap only an edge portion of the second sub-pixel electrode PE2.

The second storage line 750 and the first storage line 740 are not connected to each other. That is, the second storage line 750 and the first storage line 740 are separated from each other, physically and/or electrically, to be disconnected from each other.

The second storage line 750 receives a second storage voltage from outside thereof, such as from a component of the display device disposed outside the display panel and/or outside the display area thereof. The second storage voltage received by the second storage line 750 and the first storage voltage received by the first storage line 740 may have different magnitudes from each other. In an exemplary embodiment, for example, the second storage voltage may be a DC voltage that is greater than or less than the first storage voltage.

When the second storage voltage is set to be less than the first storage voltage, the capability of removing afterimage of the display device may be improved. On the other hand, when the second storage voltage is set to be greater than the first storage voltage, the capability of mitigating flickering phenomenon may be improved.

Alternatively, the first storage line 740 and the second storage line 750 may be connected to each other and a substantially same common voltage may be applied thereto. That is, the second storage line 750 and the first storage line 740 connected physically and/or electrically, such that the substantially same common voltage may be applied thereto.

The second storage line 750 may include a substantially same material and may have a substantially same structure (a single or multilayer structure) as those of the above-described gate line GL. In other words, the gate line GL and the second storage line 750 may be disposed in a same layer among layers disposed on the first substrate 301. In an exemplary embodiment, the gate line GL and the first storage line 740 may be formed substantially simultaneously in a substantially same process, such as from a same single material layer, in a method of manufacturing the display device.

In an exemplary embodiment, the first storage line 740 includes a horizontal (electrode) portion 741 disposed lengthwise parallel to the gate line GL and a vertical (electrode) portion 742 disposed lengthwise parallel to the data line DL, for a repair process of the data line DL. The vertical portion 742 lengthwise extends from a portion of the horizontal portion 741 overlapping the data line DL. In addition, the first storage line 740 defines a first (horizontal) hole 743 at a position overlapping the data line DL. In an exemplary embodiment, for example, the horizontal portion 741 defines the first hole 743 at a position overlapping the data line DL, and the vertical portion 742 defines a second (vertical) hole 744 at a position overlapping the data line DL. As the vertical portion 742 has the second hole 744, the vertical portion 742 is formed into double wirings.

The first storage line 740 may form two closed-loop shapes at a portion of a same data line DL which corresponds to the first sub-pixel area P1. The two closed-loop shapes at the same data line DL respectively define the first hole 743 and the second hole 744 at which the portion of the same data line DL is disposed in the top plan view. A common horizontally-extended portion of the first storage line 740 is disposed between the first and second holes 743 and 744.

In addition, the second storage line 750 includes a horizontal (electrode) portion 751 disposed lengthwise parallel to the gate line GL and a vertical (electrode) portion 752 disposed lengthwise parallel to the data line DL. The vertical portion 752 lengthwise extends from a portion of the horizontal portion 751 overlapping the data line DL. In addition, the second storage line 750 defines a first hole 753 at a position overlapping the data line DL. In an exemplary embodiment, for example, spaced apart portions of the horizontal portion 751 define an opening as a first hole 753 at a position overlapping the data line DL, and spaced apart portions of the vertical portion 752 define an opening as a second hole 754 at a position overlapping the data line DL.

The second storage line 750 may form two closed-loop shapes at a portion of a same data line DL which corresponds to the second sub-pixel area P2. The two closed-loop shapes at the same data line DL respectively define the first hole 753 and the second hole 754 at which the portion of the same data line DL is disposed in the top plan view. A common horizontally-extended portion of the second storage line 750 is disposed between the first and second holes 753 and 754.

By configuring the first and second storage lines 740 and 750 in the manner described above, the data line DL may be easily repaired, which will be described in detail with reference to FIG. 5.

Figure 5:
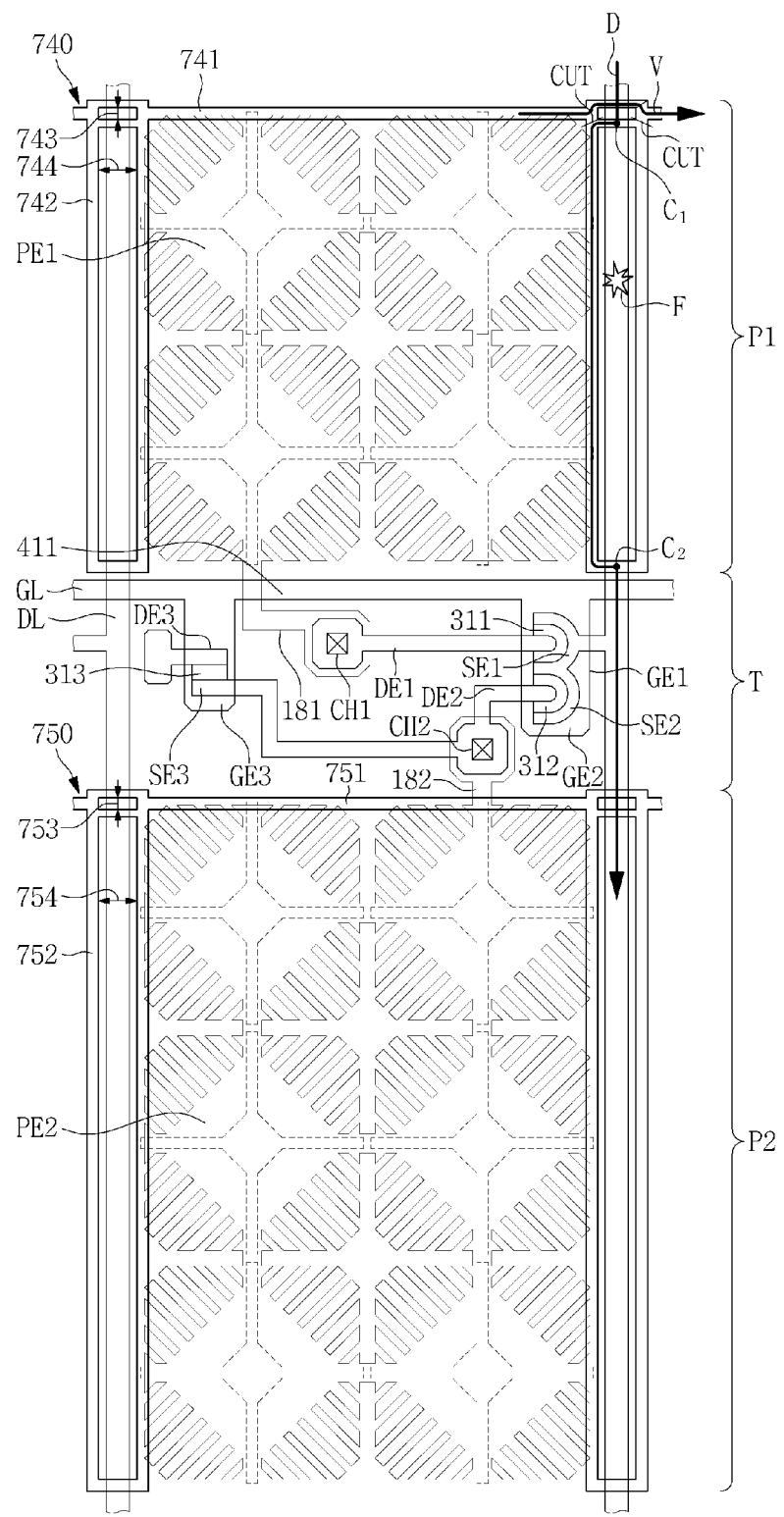
FIG. 5 is a top plan view illustrating an exemplary embodiment of a method of repairing a signal line of a display device using a storage line in a pixel of the display device of FIG. 1.

FIG. 5 is a top plan view illustrating an exemplary embodiment of a method of repairing a signal line of a display device using a storage line in a pixel of the display device of FIG. 1. While structures related to a data line at the first sub-pixel area P1 are described for repairing the signal line, the same method may be used for repairing defects using structures related to the data line at the second sub-pixel area P2.

Referring to FIG. 5, an open defect may occur at a portion F of the data line DL. In such an exemplary embodiment, a connecting portion CUT which connects the horizontal portion 741 and the vertical portion 742 of the first storage line 740 to each other is open to disconnect the horizontal portion 741 from the vertical portion 742. The data line DL is connected at C1 and C2 to the vertical portion 742, bypassing the open defect at portion F. The connection points C1 and C2 are disposed at the horizontal portions of the vertical portion 742 which overlap the data line DL at opposing sides of the first sub-pixel area P1 along the vertical direction in FIG. 1.

Accordingly, a data signal D may be normally applied to the pixels through the vertical portion 742 of the first storage line 740 connected to the data line DL and a voltage signal V may be normally applied to the pixels through the horizontal portion 741 of the first storage line 740. That is, only the vertical portion 742 of the first storage line 740 is used as the repair line of the data line DL, while the horizontal portion 741 of the first storage line 740 may still be used as a storage voltage transmission path. Accordingly, defects of the data line DL may be easily repaired as compared with a conventional structure of the prior art forming a separate conductive wiring in an additional process. In addition, as compared with the convention structure of the prior art, the first storage line 740 may still serve an original function of transmitted the voltage signal V even while a portion thereof is being used as the repair line.

Remaining configurations of an exemplary embodiment will be further described in detail below.

A gate insulating layer 310 is located on the gate line GL, the first storage line 740 and the second storage line 750. In such an exemplary embodiment, the gate insulating layer 310 may be disposed or formed over an entire surface of the first substrate 301 including the first and second storage lines 740 and 750.

The gate insulating layer 310 may include silicon nitride (SiNx), silicon oxide (SiOx), or the like. The gate insulating layer 310 may have a single layer structure or a multilayer structure including at least two insulating layers having different physical properties from each other.

The first, second and third semiconductor layers 311, 312 and 313 are each located on the gate insulating layer 310. In such an exemplary embodiment, the first semiconductor layer 311 overlaps the first gate electrode GE1, the second semiconductor layer 312 overlaps the second gate electrode GE2, and the third semiconductor layer 313 overlaps the third gate electrode GE3.

The first, second and third semiconductor layers 311, 312 and 313 may be connected to each other. Referring to FIG. 1, the first semiconductor layer 311 and the second semiconductor layer 312 are connected to each other.

Each of the first, second and third semiconductor layers 311, 312 and 313 may include amorphous silicon, polycrystalline silicon, or the like.

An ohmic contact layer 360 is located on the first, second, and third semiconductor layers 311, 312, and 313. The ohmic contact layer 360 may include silicide or n+ hydrogenated amorphous silicon doped with n-type impurities, e.g., phosphorus (P), at a relatively high concentration.

The first drain electrode DE1 and the first source electrode SE1 included in the first thin film transistor TFT1, the second drain electrode DE2 and the second source electrode SE2 included in the second thin film transistor TFT2, and the third drain electrode DE3 and the third source electrode SE3 included in the third thin film transistor TFT3 are located on the ohmic contact layer 360.

The first source electrode SE1 extends from the data line DL to the transistor area T and is located on the first gate electrode GE1 and the first semiconductor layer 311, as illustrated in FIG. 1. The first source electrode SE1 overlaps the first gate electrode GE1 and the first semiconductor layer 311. In the top plan view, the first source electrode SE1 may have one of a C-like shape, an inverted C-like shape, a U-like shape and an inverted U-like shape. In FIG. 1, for example, the first source electrode SE1 having a U-like shape is illustrated.

In an exemplary embodiment, for example, the first source electrode SE1 may include a refractory metal, e.g., molybdenum, chromium, tantalum and titanium and/or an alloy thereof. The first source electrode SE1 may have a single layer structure or a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer and a molybdenum (alloy) upper layer. In an exemplary embodiment, the first source electrode SE1 may include or be formed of any suitable metals and/or conductors rather than the aforementioned materials.

The first drain electrode DE1 is located on the first gate electrode GE1 and the first semiconductor layer 311. In the top plan view, the first drain electrode DE1 overlaps the first gate electrode GE1, the first semiconductor layer 311 and the first extension electrode 181. In such an exemplary embodiment, the first drain electrode DE1 is connected to the first extension electrode 181 through a first contact hole CH1.

The first drain electrode DE1 may include a substantially same material and may have a substantially same structure (a single layer or multilayer structure) as those of the first source electrode SE1. In other words, the first drain electrode DE1 and the first source electrode SE1 may be formed substantially simultaneously in a substantially same process, such as from a same single material layer, in a method of manufacturing the display device.

The first gate electrode GE1, the first drain electrode DE1, the first source electrode SE1, the first semiconductor layer 311 and the ohmic contact layer 360 constitute the first thin film transistor TFT1. That is, the first thin film transistor TFT1 is connected to a gate line GL and a data line DL. In such an exemplary embodiment, a channel of the first thin film transistor TFT1 is located at a portion of the first semiconductor layer 311 exposed between the first drain electrode DE1 and the first source electrode SE1. The portion of the first semiconductor layer 311 corresponding to the channel portion has a thickness less than a thickness of another or remaining portion of the first semiconductor layer 311. As illustrated in FIG. 1, the first thin film transistor TFT1 is located at the transistor area T.

The second source electrode SE2 is electrically connected to the first source electrode SE1. To this end, the second source electrode SE2 and the first source electrode SE1 may be unitarily formed. That is, the first source electrode SE1 and the second source electrode SE2 are unitarily formed (e.g., in a monolithic structure) and are connected to each other. In addition, the first source electrode SE1 and the second source electrode SE2 which are unitarily formed may have a W-like shape in the top plan view.

The second source electrode SE2 is located on the second gate electrode GE2 and the second semiconductor layer 312. The second source electrode SE2 overlaps the second gate electrode GE2 and the second semiconductor layer 312. The second source electrode SE2 may have one of a C-like shape, an inverted C-like shape, a U-like shape and an inverted U-like shape in the top plan view. In an exemplary embodiment, for example, the second source electrode SE2 having a U-like shape is illustrated in FIG. 1.

The second source electrode SE2 may include a substantially same material and may have a substantially same structure (a single layer or multilayer structure) as those of the first source electrode SE1. In other words, the second source electrode SE2 and the first source electrode SE1 may be formed substantially simultaneously in a substantially same process, such as from a same single material layer, in a method of manufacturing the display device.

The second drain electrode DE2 is located on the second gate electrode GE2 and the second semiconductor layer 312. The second drain electrode DE2 overlaps the second gate electrode GE2, the second semiconductor layer 312 and the second extension electrode 182 in the top plan view. In such an exemplary embodiment, the second drain electrode DE2 is connected to the second extension electrode 182 through a second contact hole CH2.

The second drain electrode DE2 may include a substantially same material and may have a substantially same structure (a single or multilayer structure) as those of the first source electrode SE1. In other words, the second drain electrode DE2 and the first source electrode SE1 may be formed substantially simultaneously in a substantially same process, such as from a same single material layer, in a method of manufacturing the display device.

In an exemplary embodiment, the first drain electrode DE1 and the second drain electrode DE2 have portions which extend in a substantially same direction as each other. In an exemplary embodiment, for example, as illustrated in FIG. 1, portions of each of the first drain electrode DE1 and the second drain electrode DE2 lengthwise extend in a direction toward the first source electrode SE1 and the second source electrode SE2.

The second gate electrode GE2, the second drain electrode DE2, the second source electrode SE2, the second semiconductor layer 312 and the ohmic contact layer 360 constitute the second thin film transistor TFT2. That is, the second thin film transistor TFT2 is connected to a gate line GL and a data line DL. In such an exemplary embodiment, a channel of the second thin film transistor TFT2 is located at a portion of the second semiconductor layer 312 exposed between the second drain electrode DE2 and the second source electrode SE2. The portion of the second semiconductor layer 312 corresponding to the channel portion has a thickness less than a thickness of another or remaining portion of the second semiconductor layer 312. As illustrated in FIG. 1, the second thin film transistor TFT2 is located at the transistor area T.

The third source electrode SE3 is electrically connected to the second drain electrode DE2. To this end, the third source electrode SE3 and the second drain electrode DE2 may be unitarily formed. The third source electrode SE3 is located on the third gate electrode GE3 and the third semiconductor layer 313. The third source electrode SE3 overlaps the third gate electrode GE3, the third semiconductor layer 313 and the second extension electrode 182 in the top plan view.

The third source electrode SE3 may include a substantially same material and may have a substantially same structure (a multilayer structure) as those of the first source electrode SE1. In other words, the third source electrode SE3 and the first source electrode SE1 may be formed substantially simultaneously in a substantially same process, such as from a same single material layer, in a method of manufacturing the display device.

The third drain electrode DE3 is located on the third gate electrode GE3 and the third semiconductor layer 313. The third drain electrode DE3 overlaps the third gate electrode GE3 and the third semiconductor layer 313. The third drain electrode DE3 may include a substantially same material and may have a substantially same structure (a multilayer structure) as those of the first source electrode SE1. In other words, the third drain electrode DE3 and the first source electrode SE1 may be formed substantially simultaneously in a substantially same process, such as from a same single material layer, in a method of manufacturing the display device.

The third gate electrode GE3, the third drain electrode DE3, the third source electrode SE3, the third semiconductor layer 313 and the ohmic contact layer 360 constitute the third thin film transistor TFT3. That is, the third thin film transistor TFT3 is connected to a gate line GL and a data line DL. In such an exemplary embodiment, a channel of the third thin film transistor TFT3 is located at a portion of the third semiconductor layer 313 exposed between the third drain electrode DE3 and the third source electrode SE3. The portion of the third semiconductor layer 313 corresponding to the channel portion has a thickness less than a thickness of another or remaining portion of the third semiconductor layer 313. As illustrated in FIG. 1, the third thin film transistor TFT3 is located at the transistor area T.

The data line DL is located on the gate insulating layer 310. Although not illustrated, a contact portion (e.g., an end or terminal portion) of the data line DL may have a planar area larger than a planar area of another portion of the data line DL for connection to another layer of the display device or an external driving circuit (not shown). The end or terminal portion of the data line DL may be disposed outside the display area of a display panel, such as in a non-display area thereof at which an image is not displayed.

The data line DL crosses each of the gate line GL, the first storage line 740 and the second storage line 750. Although not illustrated, a portion of the data line DL crossing the gate line GL may have a line width less than a line width of another or remaining portion of the data line DL. Similarly, a portion of the data line DL crossing the first and second storage lines 740 and 750 may have a line width less than a line width of another or remaining portion of the data line DL. Accordingly, a parasitic capacitance between the data line DL and the gate line GL and a parasitic capacitance between the data line DL and each of the first and second storage lines 740 and 750 may be reduced. The data line DL may include a substantially same material and have a substantially same structure (a multilayer structure) as those of the first source electrode SE1. In other words, the data line DL and the first source electrode SE1 may be formed substantially simultaneously in a substantially same process, such as from a same single material layer, in a method of manufacturing the display device.

Although not illustrated, a semiconductor layer and an ohmic contact layer may be additionally located below the data line DL, the first, second and third drain electrodes DE1, DE2 and DE3, and the first, second and third source electrodes SE1, SE2 and SE3.

A protection layer 320 is located on the data line DL, the first, second and third drain electrodes DE1, DE2 and DE3, and the first, second and third source electrodes SE1, SE2 and SE3. In such an exemplary embodiment, the protection layer 320 may be located over an entire surface of the first substrate 301 including the data line DL, the first, second and third drain electrodes DE1, DE2 and DE3, and the first, second and third source electrodes SE1, SE2 and SE3. As planarizing layers on the first substrate 301, the protection layer 320 serves to eliminate a height difference between components located between the protection layer 320 and the first substrate 301, e.g., components of the first substrate 301 such as the data line DL, the first, second and third drain electrodes DE1, DE2 and DE3, and the first, second and third source electrodes SE1, SE2 and SE3. In addition, the protection layer 320 also serves to protect the components of the first substrate 301.

The protection layer 320 may include an inorganic insulating material, e.g., silicon nitride ($SiN_x$) or silicon oxide ($SiO_x$). In such an exemplary embodiment, an inorganic insulating material having photosensitivity and a dielectric constant of about 4.0 may be used. In an exemplary embodiment, the protection layer 320 may have a single layer or double-layer structure including a lower inorganic layer and an upper organic layer, which is found to impart excellent insulating characteristics of an organic layer and not to damage an exposed portion of the semiconductor layers 311, 312 and 313. The protection layer 320 may have a thickness greater than or equal to about 5000 angstroms (Å), e.g., in a range from about 6000 Å to about 8000 Å.

The protection layer 320 has first and second contact holes CH1 and CH2 defined therein passing through a portion of the protection layer 320. The first drain electrode DE1 and the second drain electrode DE2 are exposed through or at the first and second contact holes CH1 and CH2.

The first sub-pixel electrode PE1 is located on the protection layer 320. In an exemplary embodiment, for example, the first sub-pixel electrode PE1 is located on the protection layer 320 of the first sub-pixel area P1.

The first sub-pixel electrode PE1 may include a transparent conductive material, e.g., indium tin oxide ("ITO") or indium zinc oxide ("IZO"). In such an exemplary embodiment, for example, ITO may include a polycrystalline material or a monocrystalline material, and IZO may include a polycrystalline material or a monocrystalline material as well.

The first sub-pixel electrode PE1 may further include or define the first extension electrode 181.

The first extension electrode 181 is located on the protection layer 320. In an exemplary embodiment, for example, the first extension electrode 181 is located on the protection layer 320 of the transistor area T. The first extension electrode 181 extends from the first sub-pixel electrode PE1 in the first sub-pixel area P1 to the transistor area T. The first extension electrode 181 is formed unitarily with the first sub-pixel electrode PE1. The first extension electrode 181 overlaps the first drain electrode DE1. The first extension electrode 181 is connected to the first drain electrode DE1 through or at the first contact hole CH1.

The first extension electrode 181 may include a material substantially the same as a material included in the first sub-pixel electrode PE1 described above.

The second sub-pixel electrode PE2 is located on the protection layer 320. In an exemplary embodiment, for example, the second sub-pixel electrode PE2 is located on the protection layer 320 of the second sub-pixel area P2.

The second sub-pixel electrode PE2 may include a material substantially the same as a material included in the first sub-pixel electrode PE1 described above.

The second sub-pixel electrode PE2 may further include or define the second extension electrode 182.

The second extension electrode 182 is located on the protection layer 320. In an exemplary embodiment, for example, the second extension electrode 182 is located on the protection layer 320 of the transistor area T. The second extension electrode 182 extends from the second sub-pixel electrode PE2 in the second sub-pixel area P2 to the transistor area T. The second extension electrode 182 is formed unitarily with the second sub-pixel electrode PE2. The second extension electrode 182 is connected to the second drain electrode DE2 through or at the second contact hole CH2.

The second extension electrode 182 may include a material substantially the same as a material included in the first sub-pixel electrode PE1 described above.

In addition, although not illustrated, a lower alignment layer may be disposed on the first sub-pixel electrode PE1, the first extension electrode 181, the second sub-pixel electrode PE2, the second extension electrode 182 and the protection layer 320. The lower alignment layer may be a vertical alignment layer or an alignment layer including a photosensitive material.

A black matrix 376 is located on a second (base) substrate 302. In an exemplary embodiment, for example, the black matrix 376 is located at a portion of the second substrate 302 excluding portions corresponding to the sub-pixel areas P1 and P2. In an exemplary embodiment, the black matrix 376 may be located on the first substrate 301 instead of the second substrate 302.

The color filter 354 is located at the sub-pixel areas P1 and P2. The color filter 354 includes one or more of a red color filter, a green color filter and a blue color filter. In an exemplary embodiment, the color filter 354 may be located on the first substrate 301 instead of the second substrate 302.

An overcoat layer 722 is located on the black matrix 376 and the color filter 354. In such an exemplary embodiment, the overcoat layer 722 may be disposed or formed over an entire surface of the second substrate 302 including the black matrix 376 and the color filter 354.

As planarizing layers on the second substrate 302, the overcoat layer 722 serves to eliminate a height difference between components located between the overcoat layer 722 and the second substrate 302, e.g., components on the second substrate 302 such as the black matrix 376 and the color filter 354. In addition, the overcoat layer 722 substantially prevents a dye forming the color filter 354 from leaking to the outside.

The common electrode 210 is located on the overcoat layer 722. In such an exemplary embodiment, the common electrode 210 may be located over an entire surface of the second substrate 302 including the overcoat layer 722. Alternatively, the common electrode 210 may be located on the overcoat layer 722 corresponding to the first sub-pixel area P1 and the second sub-pixel area P2. A common voltage is applied to the common electrode 210.

In an exemplary embodiment, although not illustrated, an upper alignment layer may be located on the common electrode 210 and the overcoat layer 722. The upper alignment layer may be a vertical alignment layer or an alignment layer which is photo-aligned using a photopolymerizable material.

An optical control layer such as a liquid crystal layer 333 is located between the first substrate 301 and the second substrate 302 to control transmittance of light for displaying an image. The liquid crystal layer 333 may include a photopolymerizable material, and such a photopolymerizable material may be a reactive monomer or a reactive mesogen. In an exemplary embodiment, a base substrate and respective layers thereon may be otherwise referred to a display substrate, where the optical control layer is disposed between display substrates facing each other.

When a surface of the first substrate 301 and a surface of the second substrate 302 that face each other are defined as upper surfaces of the corresponding substrates, respectively, and surfaces opposite to the upper surfaces are defined as lower surfaces of the corresponding substrates, respectively, an upper polarization plate (not illustrated) is located on the lower surface of the first substrate 301, and a lower polarization plate (not illustrated) is located on the lower surface of the second substrate 302.

In an exemplary embodiment, a transmission axis of the upper polarization plate and a transmission axis of the lower polarization plate are orthogonal to each other, and one of the transmission axes is arranged parallel to the length direction of the line portion 411 of the gate line GL. In an exemplary embodiment, the display device may include only one of the upper polarization plate and the lower polarization plate.

Hereinafter, another exemplary embodiment of a display device will be described with reference to FIGS. 6 and 7. Descriptions of configurations substantially identical to those of the exemplary embodiment of FIGS. 1-5 will be omitted for the convenience of explanation.

Figure 6:
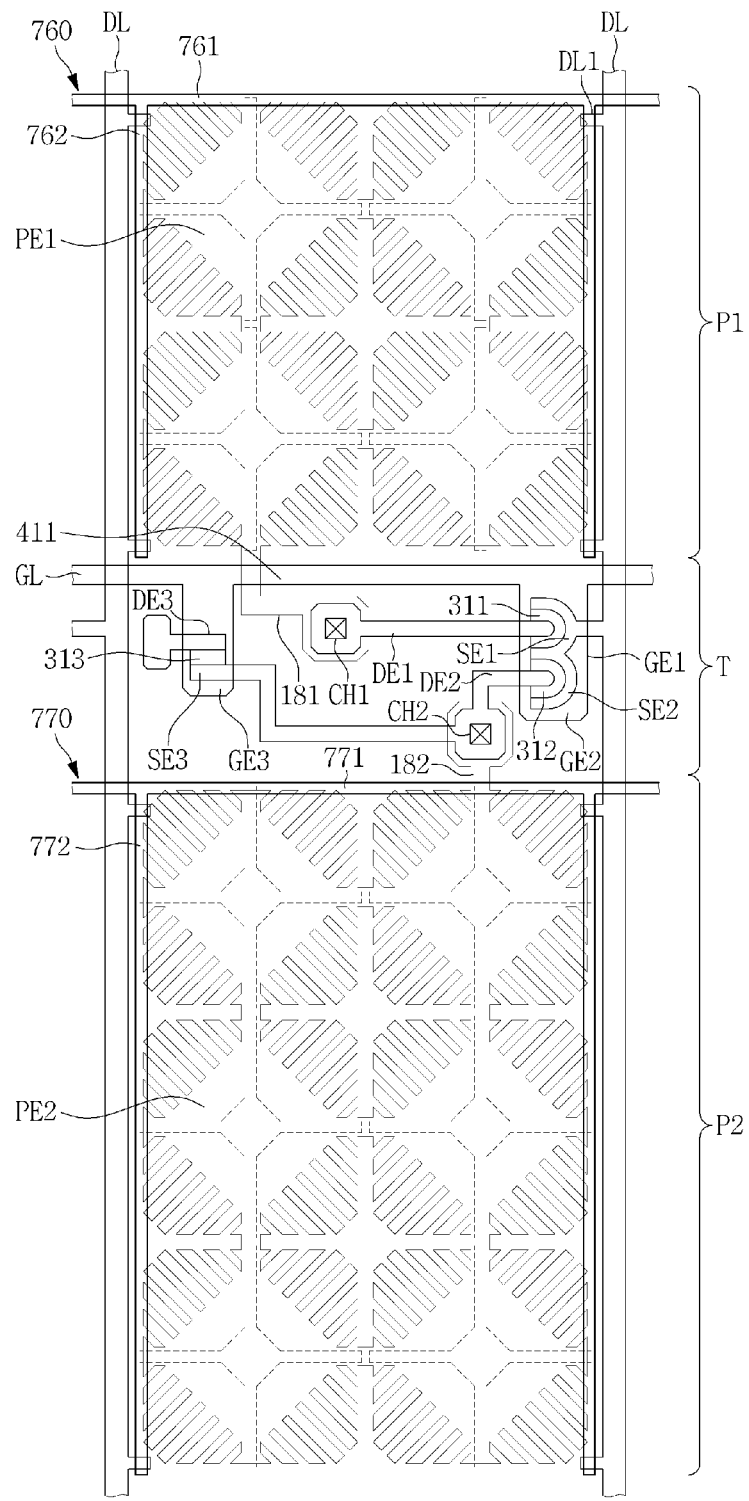
FIG. 6 is a top plan view schematically illustrating another exemplary embodiment of a pixel of a display device according to the invention.
Figure 7:
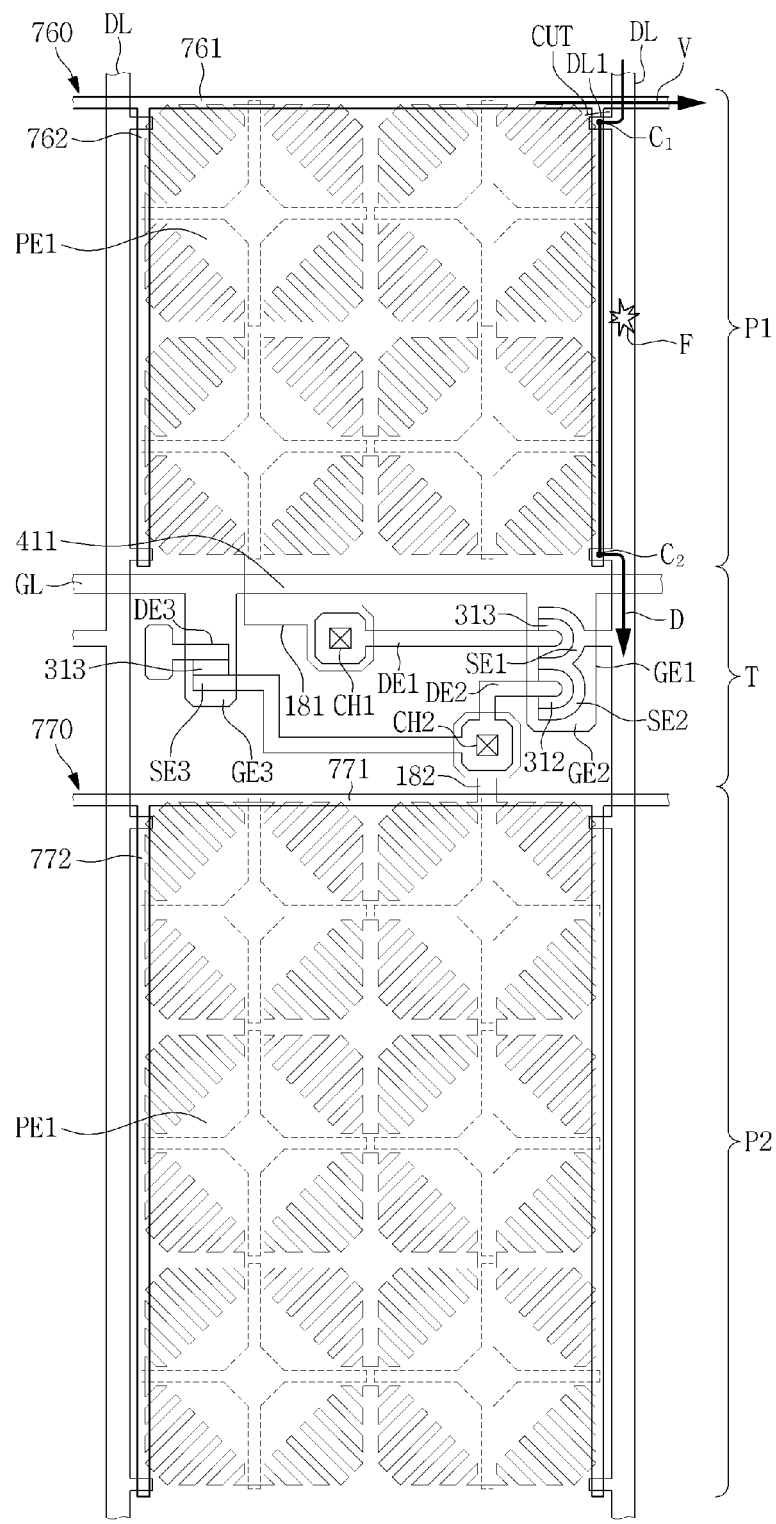
FIG. 7 is a top plan view illustrating an exemplary embodiment of a method of repairing a signal line using a storage line in a pixel of the display device of FIG. 6.

FIG. 6 is a top plan view schematically illustrating another exemplary embodiment of a pixel of a display device according to the invention, and FIG. 7 is an enlarged top view illustrating an exemplary embodiment of a method of repairing a signal line using a storage line in a pixel of the display device of FIG. 6. While structures related to a data line at the first sub-pixel area P1 are described for repairing the signal line, the same method may be used for repairing defects using structures related to the data line at the second sub-pixel area P2.

Referring to FIG. 6, a first storage line 760 includes a horizontal portion 761 arranged lengthwise parallel with a gate line GL and a vertical portion 762 arranged lengthwise parallel with a data line DL, for a repair process of the data line DL. The vertical portion 762 lengthwise extends from a portion of the horizontal portion 761 overlapping the data line DL. The vertical portion 762 is disposed between a first sub-pixel electrode PE1 and the data line DL, at only one side of the data line DL.

A second storage line 770 includes a horizontal portion 771 arranged lengthwise parallel with the gate line GL and a vertical portion 772 arranged lengthwise parallel with the data line DL. The vertical portion 772 lengthwise extends from a portion of the horizontal portion 771 overlapping the data line DL. The vertical portion 772 is disposed between a second sub-pixel electrode PE2 and the data line DL, at only one side of the data line DL.

The data line DL includes a protruding portion DL1 provided in plural to overlap a portion of the first storage line 760 and a portion of the second storage line 770. One or more protruding portions DL1 are provided to respectively overlap the vertical portions 762 and 772, as illustrated in FIG. 6. In an exemplary embodiment, for example, the protruding portion DL1 may be disposed at opposite end portions of the vertical portions 762 and 772, which area at opposing sides of the first sub-pixel area P1 and the second sub-pixel area P2, along the vertical direction, as illustrated in FIG. 6. Alternatively, the protruding portion DL1 may be further disposed at center portions of the vertical portions 762 and 772 along the vertical direction.

In addition, the protruding portion DL1 is disposed lengthwise parallel with the gate line GL, where plural protruding portions DL1 overlap a portion of the first sub-pixel electrode PE1 and a portion of the second sub-pixel electrode PE2.

By configuring the data line DL, the first storage line 760 and the second storage line 770 in the above-described manner, the data line DL may be relatively easily repaired, which will be described in detail with reference to FIG. 7.

Referring to FIG. 7, an open defect may occur at a portion F of the data line DL. In such an exemplary embodiment, a connecting portion CUT which connects the horizontal portion 761 and the vertical portion 762 of the first storage line 760 to each other is open to disconnect the horizontal portion 762 from the vertical portion 762. The protruding portions DL1 of the data line DL are connected at C1 and C2 to the vertical portion 762, bypassing the defect at portion F. Accordingly, a data signal D may be normally transmitted to the pixels through the protruding portion DL1 and the vertical portion 762 of the first storage line 760 connected to the data line DL, and a voltage signal V may be normally transmitted to the pixels through the horizontal portion 761 of the first storage line 760. Accordingly, defects of the data line DL may be relatively easily repaired as compared with a conventional structure of the prior art forming a separate conductive wiring in an additional process. In addition, as compared with the convention structure of the prior art, the first storage line 760 may still serve an original function of transmitted the voltage signal V even while a portion thereof is being used as the repair line.

Hereinafter, still another exemplary embodiment of a display device will be described with reference to FIG. 8. Descriptions of configurations substantially identical to those of the exemplary embodiments of FIGS. 1-7 will be omitted for the convenience of explanation.

Figure 8:
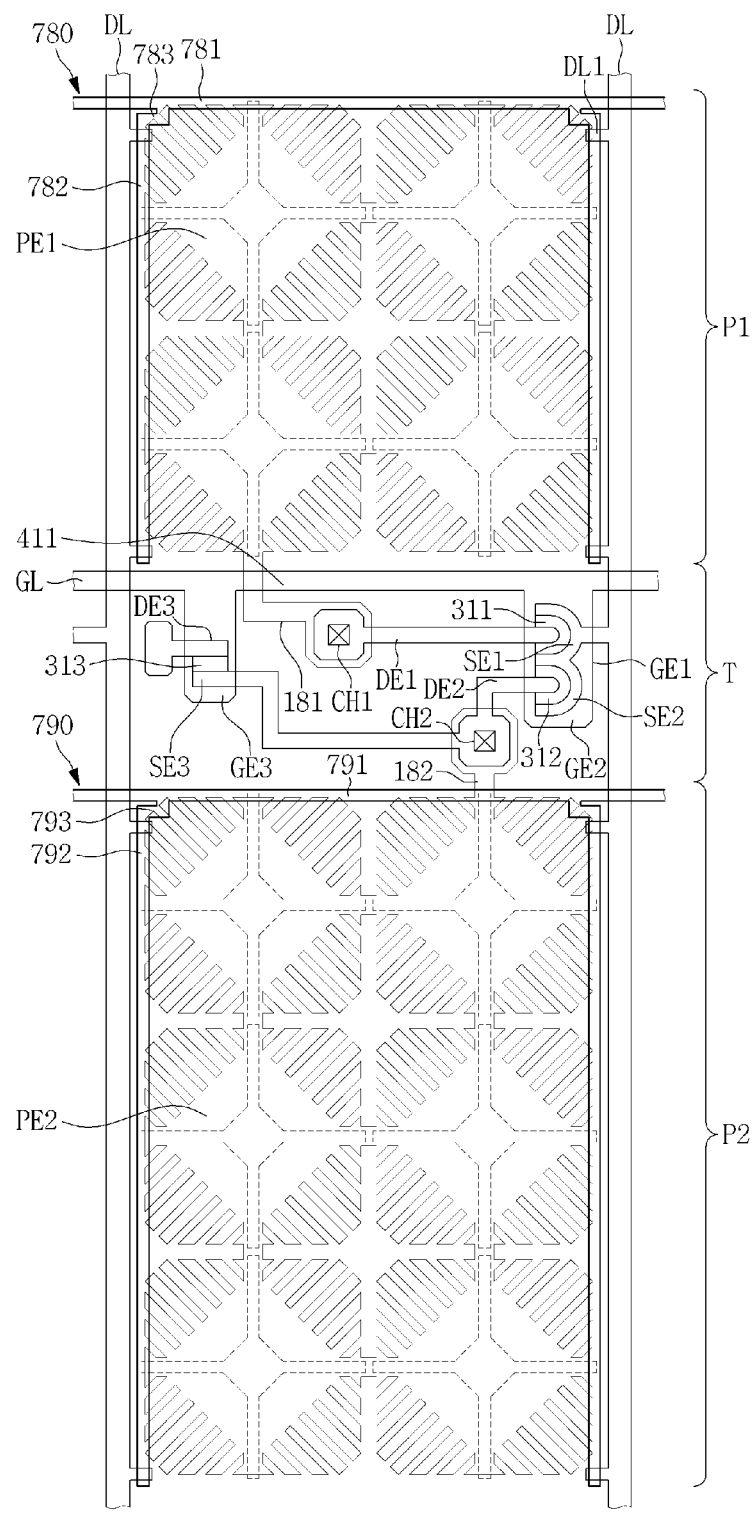
FIG. 8 is a top plan view schematically illustrating still another exemplary embodiment of a pixel of a display device according to the invention.

FIG. 8 is a top plan view schematically illustrating still another exemplary embodiment of a pixel of a display device according to the invention.

Referring to FIG. 8, a first storage line 780 and a second storage line 790 further include bent portions 783 and 793 which connect horizontal portions 781 and 791 and vertical portions 782 and 792, respectively. One or more protruding portion DL1 of respective data lines DL overlaps the bent portions 783 and 793. As the bent portions 783 and 793 are provided, process efficiency of a repair process may be improved.

In the structure of FIG. 7, a connecting portion CUT which connects a horizontal portion of a storage line to a vertical portion thereof, is disposed relatively close to a respective data line DL. In the exemplary embodiment of FIG. 8, the connecting portion (CUT in FIG. 7) which connects the horizontal portion 781 to the vertical portion 782 is disposed spaced apart from a respective data line DL by a distance greater than that in FIG. 7. That is, by including the bent portions 783 and 793 in a (repair) process of opening or disconnecting the horizontal portion 761 from the vertical portion 762 as illustrated in FIG. 7, a connecting portion which connects the horizontal portion 761 to the vertical portion 762 may be more spaced apart from the data line DL as compared to the connecting portion CUT in FIG. 7. Accordingly, by increasing a spacing of the connecting portion from the data line DL, damage to the data line DL may be substantially prevented in the repair process. Other configurations and effects of the exemplary embodiment in FIG. 8 are substantially the same as those of the exemplary embodiment in FIG. 7, and the repair method of the exemplary embodiment in FIG. 8 is substantially the same as that of the exemplary embodiment in FIG. 7.

As set forth hereinabove, in a display device according to one or more exemplary embodiments, a storage line functions both as a signal-transmitting or voltage-transmitting line and as a repair line of a data line, thereby reducing a disconnection rate of the data line.

In addition, according to one or more exemplary embodiments, only a vertical portion of the storage line is used as the repair line of the data line, which is different from a conventional structure in a conventional repair method, and thus a horizontal portion of the storage line may still be used as a storage voltage transmission path.

While the invention has been illustrated and described with reference to the exemplary embodiments thereof, it will be apparent to those of ordinary skill in the art that various changes in form and detail may be formed thereto without departing from the spirit and scope of the invention.

What is claimed is:
1. A display device comprising:
    a substrate including a display area at which an image is displayed; and
    on the substrate in the display area thereof:
        a data line and a gate line on the substrate;
        a thin film transistor connected to the gate line and the data line;
        a pixel electrode connected to the thin film transistor; and
        a storage line which overlaps the pixel electrode,
        wherein the storage line has a first hole at a position overlapping the data line.
2. The display device of claim 1, wherein the storage line comprises:
    a horizontal portion extended parallel to the gate line, and
    a vertical portion extended from the horizontal electrode portion to be parallel to the data line.
3. The display device of claim 2, wherein the horizontal portion has the first hole at a position overlapping the data line.

4. The display device of claim 2, wherein the vertical portion has a second hole at a position overlapping the data line.

5. The display device of claim 2, wherein the vertical portion extends from a portion of the horizontal portion overlapping the data line.

6. A display device comprising:
a substrate;
a data line and a gate line on the substrate, the data line transmitting a data signal;
a thin film transistor connected to the gate line and the data line;
a pixel electrode connected to the thin film transistor; and
a storage line which overlaps the pixel electrode,
wherein the data line comprises a protrusion extended directly from the data line, the protrusion overlapping the storage line.

7. The display device of claim 6, wherein the protrusion of the data line is extended parallel with the gate line.

8. The display device of claim 6, wherein the protrusion of the data line overlaps the pixel electrode.

9. The display device of claim 6, wherein the storage line comprises:
a horizontal portion extended parallel to the gate line, and
a vertical portion extended from the horizontal portion to be parallel to the data line.

10. The display device of claim 9, wherein the vertical portion of the storage line is disposed between the pixel electrode and the data line.

11. The display device of claim 9, wherein the protrusion of the data line overlaps the vertical portion of the storage line.

12. The display device of claim 11, wherein the protrusion of the data line overlaps the pixel electrode.

13. The display device of claim 9, wherein the vertical portion of the storage line extends from the horizontal portion of the storage line at a position of the data line.

14. The display device of claim 9, wherein the storage line further comprises a bent portion connecting the horizontal portion and the vertical portion to each other, at a position of the data line.

15. The display device of claim 14, wherein the protrusion of the data line overlaps the bent portion of the storage line which connects the horizontal and vertical portions to each other.

16. The display device of claim 6, wherein the protrusion includes a plurality of protrusions overlapping the storage line.

17. The display device of claim 6, wherein the protrusion does not contact the storage line.

18. A display device comprising:
a substrate including a display area at which an image is displayed; and
on the substrate in the display area thereof:
a gate line and a data line through which data signals are transmitted to display the image;
a thin film transistor connected to the data line;
a pixel electrode connected to the thin film transistor and adjacent to the data line in a first direction parallel to the gate line; and
a storage line which overlaps the pixel electrode and through which a voltage signal is applied to the display area, the storage line comprising:
a horizontal portion extended parallel to the gate line, and
a vertical portion extended from the horizontal portion at the data line, the vertical portion extended along the data line which is adjacent to the pixel electrode in the first direction,
wherein the vertical portion of the storage line overlaps the data line adjacent to the pixel electrode at two positions of the data line.

19. The display device of claim 18, wherein the vertical portion comprises:
two vertical portions each extended along the data line to be respectively disposed at opposing sides of the data line in the first direction, and
two horizontal portions each extended along the first direction and connecting the two vertical portions to each other,
wherein in a top plan view, the vertical portion of the storage line overlaps the data line adjacent to the pixel electrode at the two horizontal portions.

20. The display device of claim 18, wherein
the vertical portion extended along the data line is disposed between the data line and the pixel electrode adjacent to each other in the first direction,
the data line comprises two protruding portions each extended towards the pixel electrode, and
in a top plan view, the vertical portion of the storage line which is disposed between the data line and the pixel electrode overlaps the data line at the two protruding portions thereof.

* * * * *